US011374395B2

(12) United States Patent
Zhang et al.

(10) Patent No.: US 11,374,395 B2
(45) Date of Patent: Jun. 28, 2022

(54) REMOTE POWER UNIT, DIRECT CURRENT POWER SYSTEM AND DIRECT CURRENT POWER SYSTEM FAULT DETECTION METHOD

(71) Applicant: Huawei Technologies Co., Ltd., Shenzhen (CN)

(72) Inventors: Guoqing Zhang, Shenzhen (CN); Andreas Stiedl, Munich (DE); Zhiming Xiao, Dongguan (CN); Michael Tabakov, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 312 days.

(21) Appl. No.: 16/729,280

(22) Filed: Dec. 27, 2019

(65) Prior Publication Data

US 2020/0136428 A1 Apr. 30, 2020

Related U.S. Application Data

(63) Continuation of application No. PCT/EP2017/066148, filed on Jun. 29, 2017.

(51) Int. Cl.
*H02H 3/00* (2006.01)
*H02H 3/16* (2006.01)
(Continued)

(52) U.S. Cl.
CPC ............... *H02H 3/16* (2013.01); *G01R 31/50* (2020.01); *G01R 31/52* (2020.01);
(Continued)

(58) Field of Classification Search
None
See application file for complete search history.

(56) References Cited

U.S. PATENT DOCUMENTS 6,002,563 A 12/1999 Esakoff et al.
2003/0067723 A1 4/2003 Suzui et al.
(Continued)

FOREIGN PATENT DOCUMENTS

CN 201083789 Y 7/2008
CN 203673005 U 6/2014
(Continued)

OTHER PUBLICATIONS

"Environmental Engineering (EE); Earthing and bonding of 400 VDC data and telecom (ICT) equipment," Draft ETSI EN 301 605 V1.1.1, pp. 1-39, The European Telecommunications Standards Institute, Sophia Antipolis, France (Jan. 2013).
(Continued)

*Primary Examiner* — Stephen W Jackson
(74) *Attorney, Agent, or Firm* — Leydig, Voit & Mayer, Ltd.

(57) ABSTRACT

A remote power unit for providing direct current power to a remote power receiver in a direct current power system is provided. A residual current protection circuit comprises a first switch, which opens a positive voltage rail, and a second switch, which open a negative voltage rail. A first current sensor measures a first residual current between the first switch and the remote power receiver, while the first switch is closed and the second switch is opened. A second current sensor measures a second residual current between the second switch and the remote power receiver, while the second switch is closed and the first switch is open. A controller detects a residual current event, if the first residual current and/or the second residual current are above a residual current threshold.

16 Claims, 12 Drawing Sheets

(51) Int. Cl.
*H02J 13/00* (2006.01)
*G01R 31/52* (2020.01)
*H02H 1/00* (2006.01)
*G01R 31/50* (2020.01)

(52) U.S. Cl.
CPC ..... *H02H 1/0007* (2013.01); *H02J 13/00002* (2020.01); *H02J 13/0004* (2020.01)

(56) References Cited

U.S. PATENT DOCUMENTS

2007/0285057 A1 12/2007 Yano
2014/0368211 A1 12/2014 Inoue et al.

FOREIGN PATENT DOCUMENTS

| CN | 103988087 A | 8/2014 | |
|----|---|---|---|
| CN | 206117309 U | 4/2017 | |
| CN | 106877366 A | 6/2017 | |
| EP | 2219042 A1 * | 8/2010 | ........... B60L 3/0023 |
| EP | 2801836 A1 | 11/2014 | |
| WO | WO-2008116676 A1 * | 10/2008 | ............... H02H 3/32 |

OTHER PUBLICATIONS

"International Standard: Low-voltage electrical installations, Part 4-41: Protection for safety—Protection against electric shock," CEI/IEC 60364-4-41, pp. 1-74, The International Electrotechnical Commission, Geneva, Switzerland (Dec. 2005).

* cited by examiner

Regular operation

Regular operation

REMOTE POWER UNIT, DIRECT CURRENT POWER SYSTEM AND DIRECT CURRENT POWER SYSTEM FAULT DETECTION METHOD

CROSS-REFERENCE TO RELATED APPLICATIONS

This application is a continuation of International Application No. PCT/EP2017/066148, filed on Jun. 29, 2017, the disclosure of which is hereby incorporated by reference in its entirety.

TECHNICAL FIELD

The disclosure relates to higher voltage direct current (HVDC) power systems including remote power units and remote power receivers. Also, the disclosure relates to a direct current power system fault detection method.

BACKGROUND

During recent years, a trend has emanated towards ever increasing voltage of direct current power systems. From a relatively safe −48 VDC, the voltage has shifted to hundreds volts. This leads to a significant shock hazard, which needs to be remedied. At the same time, a high availability of such power systems is necessary. Therefore, fault detection should not be overly sensitive, so as to not unnecessarily reduce the system availability.

SUMMARY

Accordingly, an object is to provide a remote power unit, a direct current power system and a direct current power system fault detection method, which allows to effectively prevent shock hazard, while at the same time achieving a high system availability.

The object is solved by the features of claim 1 for the apparatus, claim 12 for the system and claim 15 for the method. The dependent claims contain further developments.

According to a first aspect of the invention, a remote power unit for providing direct current power to a remote power receiver in a direct current power system, and in particular, a HVDC power system is provided. The remote power unit comprises a residual current protection circuit, which in turn comprises a power supply interface, configured to receive direct current power from a power supply, a direct current interface, configured to connect the remote power unit to the remote power receiver via a positive voltage line and a negative voltage line, a first switch, which is configured to open a positive voltage rail between the power supply interface and the direct current interface. Moreover, the residual current protection circuit comprises a second switch, which is configured to open a negative voltage rail between the power supply interface and the direct power interface. Also, the residual current protection circuit comprises a first current sensor, which is configured to measure a first residual current between the first switch and the direct current interface, while the first switch is closed and the second switch is opened, and a second current sensor, which is configured to measure a second residual current between the second switch and the direct current interface, while the second switch is closed and the first switch is open. Furthermore, the residual current protection circuit comprises a controller, which is configured to detect a residual current event, if the first residual current and/or the second residual current are above a residual current threshold. It is thereby possible to easily detect if an undesired conductive connection between one of the voltage rails and ground, for example in form of a user touching a live wire, is present. In other words, the residual current detection can be performed more effectively, thereby preventing electrical shock hazards more effectively.

According to a first embodiment of the first aspect, the controller is configured to control the operation of the first switch and the second switch in a periodical and alternating manner. It is thereby possible to detect faults on both voltage rails in a short amount of time.

According to a second embodiment of the first aspect or the first embodiment of the first aspect, the controller is configured to periodically and alternatingly close the first switch and the second switch, open the first switch and close the second switch, and/or close the first switch and open the second switch. It is thereby switched between regular operation, in which the first switch and the second switch are both closed and alternatingly measuring the residual current while the first switch is open and the second switch is closed and/or the first switch is closed and the second switch is open.

According to a third implementation form of the first aspect, the controller is configured to set an opening time of the first switch and/or an opening time of the second switch to 1 ms to 100 ms, preferably 5 ms to 20 ms, most preferably to 10 ms, and/or set a closed time of the first switch and/or a closed time of the second switch to 10 ms to 1000 ms, preferably 50 ms to 200 ms, most preferably 100 ms. A very quick detection of faults is thereby possible, while keeping the downtime of the system to a minimum.

According to a fourth implementation form of the first aspect, the controller is configured to switch the first switch and the second switch to open, if a residual current event is detected. This leads to a significant increase in safety, since when both switches are open, no more current flow can occur, and any shock hazard is prevented.

According to a fifth implementation form of the first aspect, the controller is configured to switch the first switch and second switch to open, if at least two consecutive residual current events are detected. This leads to a significant increase in system availability, since a single glitch leading to an erroneously detected residual current event will not disrupt system operations.

According to a sixth implementation form of the first aspect, the remote power unit comprises an insulation monitor, configured to detect if the positive voltage rail and/or the negative voltage rail has an insulation defect. This leads to a further significant increase in safety.

According to a first implementation form of the sixth implementation form of the first aspect, the residual current protection circuit is configured to operate only if the insulation monitor has detected that the positive voltage rail and/or the negative voltage rail has an insulation defect. In this case, the first switch and the second switch are closed when the residual current protection circuit is not operating. This significantly increases the system availability, since there is no necessity of checking residual current events, if there is no insulation defect.

According to a seventh implementation form of the first aspect, the first switch and the second switch are transistors. This allows for a very simple implementation of the remote power unit.

According to an eighth implementation form of the first aspect, the first current sensor and the second current sensor are shunt current sensors or magnetic current sensors. This also allows for a very simple implementation of the remote power unit.

According to a ninth implementation form of the first aspect, the remote power unit comprises a power supply, configured to provide direct current power to the remote power unit through the direct current interface. This allows for a simple construction of the remote power unit.

According to a second aspect of the invention, a direct current power system is provided. The direct current power system comprises a remote power unit as described before and at least one remote power receiver. Such a system allows for effectively preventing shock hazard, while at the same time achieving a high system availability.

According to a first implementation form of the second aspect, the remote power receiver is connected to the remote power unit via a positive voltage line and a negative voltage line. This allows for a very simple connection of the remote power unit and the remote power receiver.

According to a second implementation form of the second aspect, the remote power receiver comprises an energy storage, which is configured to store energy while the first switch and the second switch are closed and power is transmitted from the remote power unit to the remote power receiver, and to provide the stored energy while the first switch or the second switch are open, and no power is transmitted from the remote power unit to the remote power receiver. This allows for continuous operation of the remote power receiver, even during the brief moments, in which for residual current event detection purposes, the first switch and/or the second switch are open.

According to a third aspect of the invention, a direct current power system fault detection method is provided. A remote power unit of the remote power system provides direct current power to a remote power receiver of a direct current power system. The method comprises generating direct current power by a power supply, switching a first switch, arranged within a positive voltage rail of the remote power unit, on, and switching a second switch, arranged within a negative voltage rail of the remote power unit on, switching the first switch off, measuring a first residual current between the first switch and a direct current interface of the remote power unit and measuring second residual current between the second switch and the direct current interface, determining, if the first residual current and/or the second residual current exceed a residual current threshold, determining a residual current event, if the first residual current and/or the second residual current exceed a residual current threshold, switching the first switch and the second switch on, switching the second switch off, measuring a first residual current between the first switch and a direct current interface of the remote power unit and measuring second residual current between the second switch and the direct current interface, determining, if the first residual current and/or the second residual current exceed a residual current threshold, determining a residual current event, if the first residual current and/or the second residual current exceed a residual current threshold, switching the first switch and the second switch off, if at least two residual current event are detected.

It is thereby possible to easily detect if an undesired conductive connection between one of the voltage rails and ground, for example, in form of a user touching a live wire, is present.

According to a first implementation form of the third aspect, an operation of the first switch and the second switch in a periodical and alternating manner is controlled by the controller. It is thereby possible to detect faults on both voltage rails in a short amount of time.

According to a second implementation form of the third aspect, periodically and alternatingly,
  the first switch and the second switch are closed,
  the first switch is opened and the second switch is closed, and/or
  the first switch is closed and the second switch is opened.

It is thereby switched between regular operation, in which the first switch and the second switch are both closed and alternatingly measuring the residual current while the first switch is open and the second switch is closed and/or the first switch is closed and the second switch is open.

According to a third implementation form of the third aspect, an opening time of the first switch and/or an opening time of the second switch is set to 1 ms to 100 ms, preferably 5 ms to 20 ms, most preferably to 10 ms. Additionally or alternatively, a closed time of the first switch and/or a closed time of the second switch is set to 10 ms to 1000 ms, preferably 50 ms to 200 ms, most preferably to 100 ms. A very quick detection of faults is thereby possible, while keeping the downtime of the system to a minimum.

According to a fourth implementation form of the third aspect, the first switch and the second switch are opened, if a residual current event is detected. This leads to a significant increase in safety, since when both switches are open, no more current flow can occur, and any shock hazard is prevented.

According to a fifth implementation form of the third aspect, the first switch and the second switch are opened, if at least two consecutive residual current events are detected. This leads to a significant increase in system availability, since a single glitch leading to an erroneously detected residual current event will not disrupt system operations.

According to a sixth implementation form of the first aspect, an insulation monitor detects if the positive voltage rail and/or the negative voltage rail has an insulation defect. This leads to a further significant increase in safety.

According to a first implementation form of the sixth implementation form of the third aspect, only if the insulation monitor has detected that the positive voltage rail and/or the negative voltage rail has an insulation defect, the current protection circuit operates. The first switch and the second switch are closed, while the residual current protection circuit is not operating. This significantly increases the system availability, since there is no necessity of checking residual current events, if there is no insulation defect.

According to a fourth aspect of the invention, a residual current protection circuit, for use in a remote power unit providing direct current power to a remote power receiver, is provided. The residual current protection circuit comprises a power supply interface, configured to receive direct current power from a power supply, a direct current interface, configured to connect the remote power unit to the remote power receiver via a positive voltage line and a negative voltage line, a first switch, configured to open a positive voltage rail between the power supply interface and the direct current interface, a second switch, configured to open a negative voltage rail between the power supply interface and the direct current interface, a first current sensor, configured to measure a first residual current between the first switch and the direct current interface, while the first switch is closed and the second switch is open, a second current sensor, configured to measure a second residual current between the second switch and the direct current interface, while the second switch is closed and the first switch is open, and a controller, configured to detect a residual current event, if the first residual current and/or the second residual current are above a residual current threshold.

According to a first embodiment of the fourth aspect, the controller is configured to control the operation of the first switch and the second switch in a periodical and alternating manner. It is thereby possible to detect faults on both voltage rails in a short amount of time.

According to a second embodiment of the fourth aspect or the first embodiment of the first aspect, the controller is configured to periodically and alternatingly close the first switch and the second switch, open the first switch and close the second switch, and/or close the first switch and open the second switch. It is thereby switched between regular operation, in which the first switch and the second switch are both closed and alternatingly measuring the residual current while the first switch is open and the second switch is closed and/or the first switch is closed and the second switch is open.

According to a third implementation form of the fourth aspect, the controller is configured to set an opening time of the first switch and/or an opening time of the second switch to 1 ms to 100 ms, preferably 5 ms to 20 ms, most preferably to 10 ms, and/or set a closed time of the first switch and/or a closed time of the second switch to 10 ms to 1000 ms, preferably 50 ms to 200 ms, most preferably 100 ms. A very quick detection of faults is thereby possible, while keeping the downtime of the system to a minimum.

According to a fourth implementation form of the fourth aspect, the controller is configured to switch the first switch and the second switch to open, if a residual current event is detected. This leads to a significant increase in safety, since when both switches are open, no more current flow can occur, and any shock hazard is prevented.

According to a fifth implementation form of the fourth aspect, the controller is configured to switch the first switch and second switch to open, if at least two consecutive residual current events are detected. This leads to a significant increase in system availability, since a single glitch leading to an erroneously detected residual current event will not disrupt system operations.

According to a sixth implementation form of the fourth aspect, the first switch and the second switch are transistors. This allows for a very simple implementation of the remote power unit.

According to an seventh implementation form of the fourth aspect, the first current sensor and the second current sensor are shunt current sensors or magnetic current sensors. This also allows for a very simple implementation of the remote power unit.

Generally, it has to be noted that all arrangements, devices, elements, units and means and so forth described in the present application could be implemented by software or hardware elements or any kind of combination thereof. Furthermore, the devices may be processors or may comprise processors, wherein the functions of the elements, units and means described in the present applications may be implemented in one or more processors. All steps which are performed by the various entities described in the present application as well as the functionality described to be performed by the various entities are intended to mean that the respective entity is adapted to or configured to perform the respective steps and functionalities. Even if in the following description or specific embodiments, a specific functionality or step to be performed by a general entity is not reflected in the description of a specific detailed element of that entity which performs that specific step or functionality, it should be clear for a skilled person that these methods and functionalities can be implemented in respect of software or hardware elements, or any kind of combination thereof.

BRIEF DESCRIPTION OF THE DRAWINGS

The present invention is in the following explained in detail in relation to embodiments of the invention in reference to the enclosed drawings, in which.

DESCRIPTION OF THE EMBODIMENTS

Figure 1:
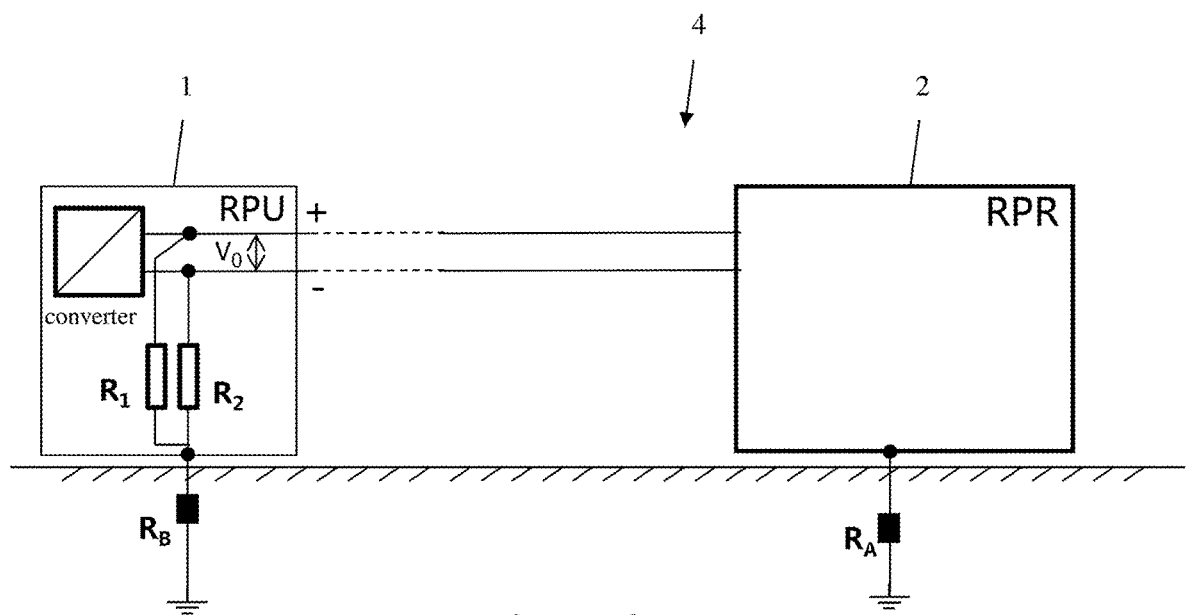
FIG. 1 shows a general setup of an exemplary direct current power system.

First, we demonstrate the general construction of a direct current power system along FIG. 1. With regard to FIG. 2-FIG. 6, different fault scenarios in a regular direct current power system are described. With regard to FIG. 7 and FIG. 8, the operation of a residual current detector is shown. Along FIG. 8-FIG. 10, the construction and function (working principle) of a direct current power system according to the second aspect of the invention and a remote power unit according to the first aspect of the invention are described in detail. With regard to FIG. 11-FIG. 15, along a number of different signals present within embodiments of the direct current power system of the second aspect of the invention and the remote power unit of the first aspect of the invention, the function is further detailed. Finally, along FIG. 16-FIG. 18 the function of different embodiments of the direct current power system fault detection method are shown in detail. Similar entities and reference numbers in different figures have been partially omitted.

In the following, some definitions of key abbreviations used in this document are shown:

HVDC: Higher Voltage Direct Current. In comparison to regular 48V Direct Current used in the industry.

RPU: Remote Power Unit. It supplies HVDC power to distant equipment.

RPR: Remote Power Receiver. It is connected to the RPU and receives power from RPU.

Residual current: Current imbalance between the conductors in a direct current power system, and in particular, the current imbalance between a positive voltage rail and a negative voltage rail (will be explained later).

In FIG. 1, a first exemplary direct current power system 4 is shown. The direct current power system 4 comprises a remote power unit (RPU) 1, which is connected to a remote power receiver (RPR) 2. The RPU 1 generates the direct current power and provides it through a positive voltage line and a negative voltage line to the RPR 2. The direct current power is provided at a voltage $V_0$ between an internal positive voltage rail and a negative voltage rail, which are then connected to the positive voltage line and negative voltage line for transmission. The different terms "voltage rail" and "voltage line" were chosen to differentiate between the power bus outside of the devices (=voltage line) and the voltage carrying party within the devices (=voltage rail). Internally, the RPU 1 comprises a converter, for generating the direct current power, for example from an alternating current power. The positive voltage rail is connected to a ground connection through a resistance $R_1$, while the negative voltage rail is connected to a ground connection through a resistance $R_2$. The ground connection itself has a resistance $R_B$. On the other hand, the housing of the RPR 2 is also connected to ground through a ground connection resistance $R_A$.

Figure 2:
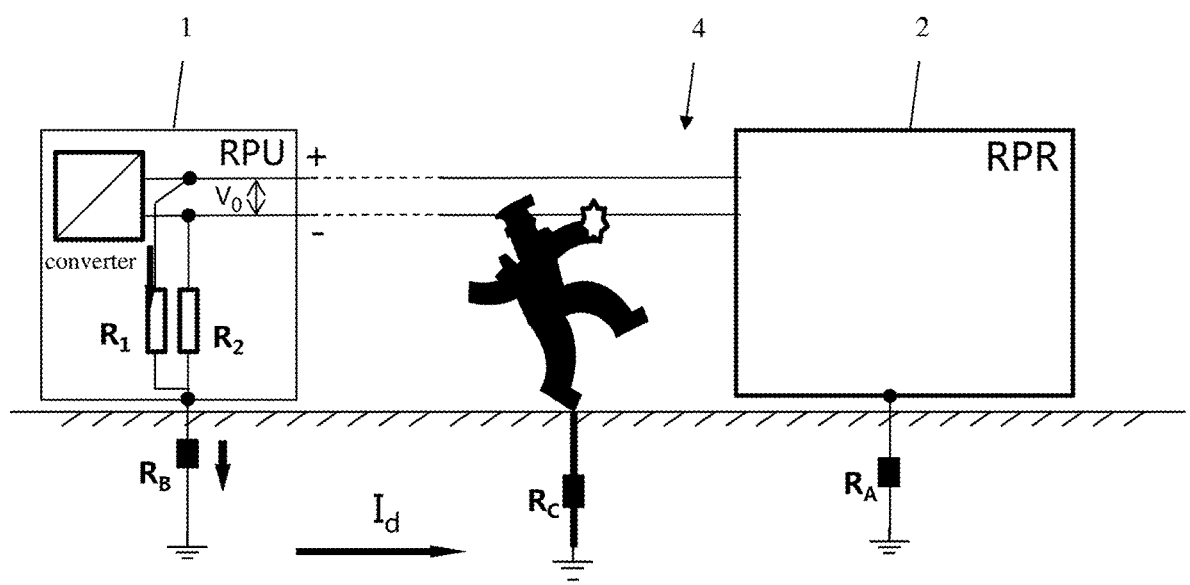
FIG. 2 shows an exemplary direct current power system with a direct contact fault.

In FIG. 2, the situation during a direct contact fault is shown. This means that a person is touching one of the active lines, here for example the negative voltage line. The person is grounded through a ground connection having a ground resistance $R_C$. Therefore, a current $I_d$ travels from the positive voltage rail within the RPU 1 through resistance $R_1$, through ground resistance $R_B$ of the RPU 1 through the ground resistance $R_C$ of the user to the user. Due to the high value of resistance of $R_1$, the current $I_d$ is unproblematic and does not pose a significant health risk to the user.

Figure 3:
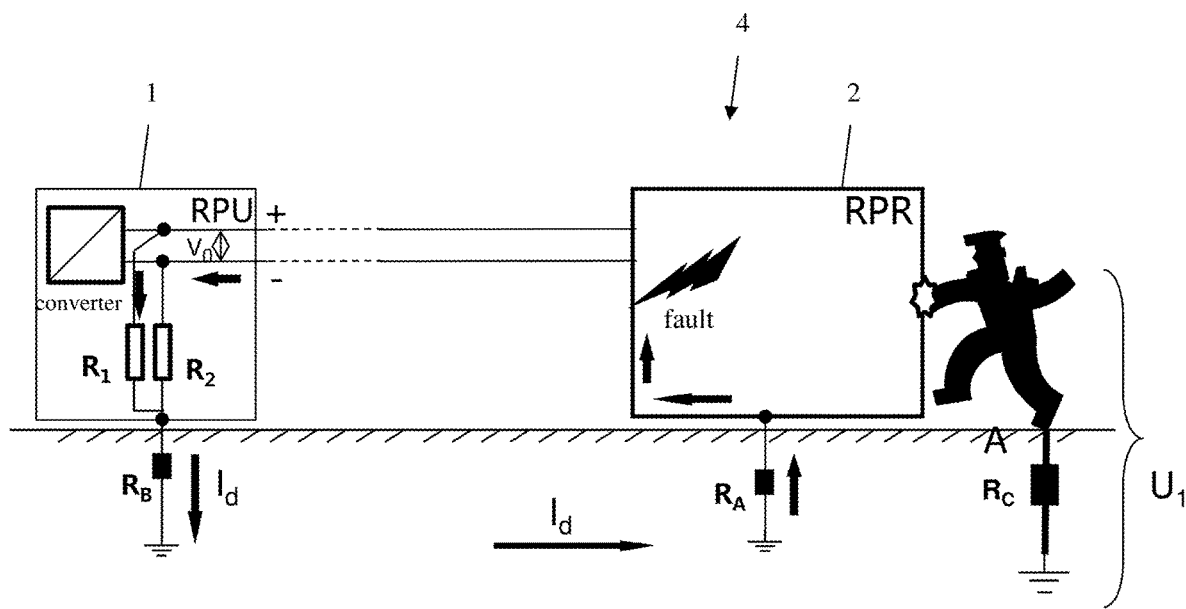
FIG. 3 shows an exemplary direct current power system with an indirect contact fault.

In FIG. 3, a direct current power system 4 with an indirect contact fault is shown. Here, the negative voltage line is erroneously connected to a conductive housing of the RPR 2. A user touches the housing of the RPR 2 and is grounded through a ground connection having a resistance $R_C$. This also leads to a current $I_d$ from the positive voltage rail within the RPU 1 through resistance $R_1$ through the ground connection with ground resistance $R_B$ through ground to the ground resistance $R_A$ to the housing of the RPR 2 and back to the RPU 1 through the negative voltage rail. Since the user forms a parallel connection to ground with regard to the ground resistance $R_A$ of the RPR 2, a voltage $U_1$ occurs between ground and the user. Since the ground resistance $R_A$ of the RPR 2 and the ground resistance $R_C$ of the user are comparable, but the resistance of the user is significantly greater than the practically non-existing resistance of the conductive housing of the RPR 2, only a tiny fraction of the current $I_d$ flows through the user. This also leads to a very small health risk.

Figure 4:
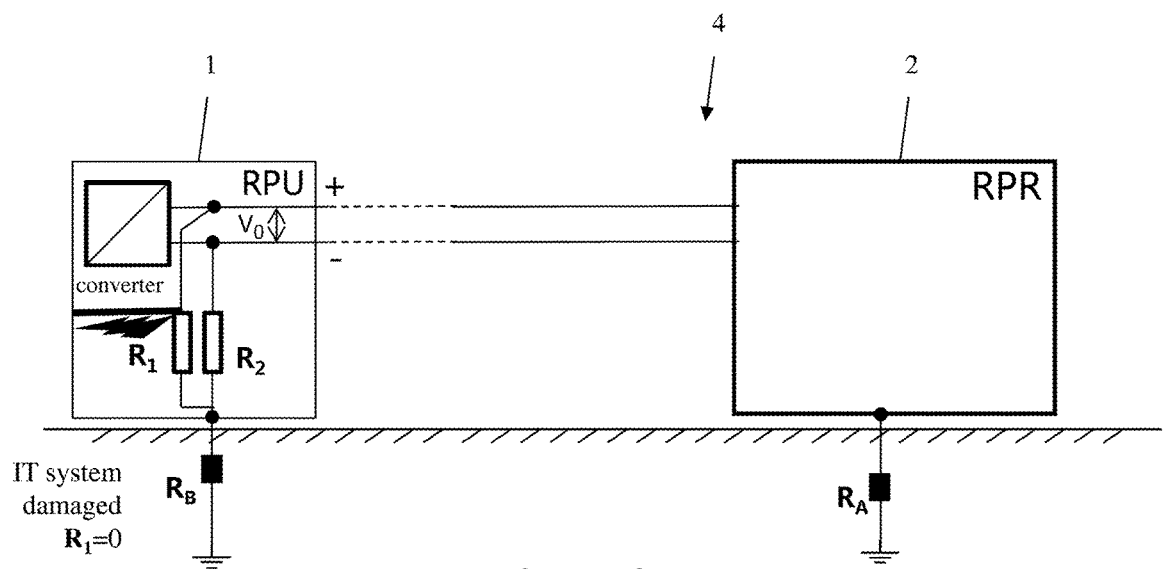
FIG. 4 shows an exemplary direct current power system with an insulation defect.

In FIG. 4, a direct current power system 4 with an insulation defect within the RPU 1 is shown. Here, the resistance $R_1$ is short circuited. This means that the positive voltage rail within the RPU 1 is directly connected to ground through the ground resistance $R_B$. During regular operation, this is unproblematic, since power can still be transmitted from the RPU 1 to the RPR 2. If a direct connection fault or an indirect connection fault occurs though, the situation is highly dangerous to the user. This is further shown in FIG. 5 and FIG. 6.

Figure 5:
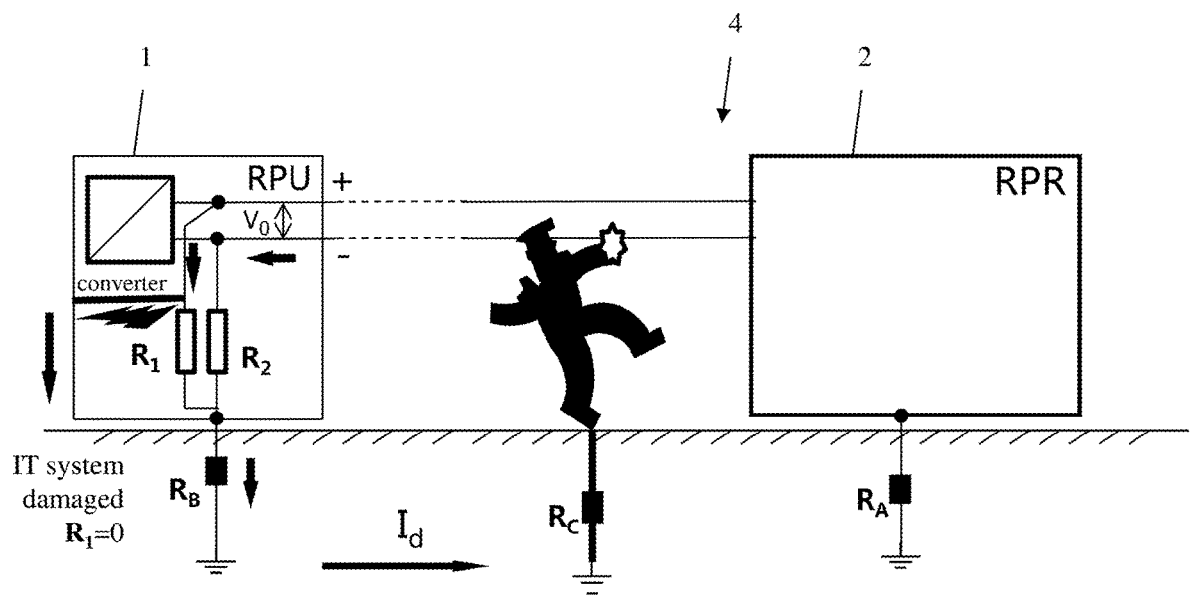
FIG. 5 shows an exemplary direct current power system with an insulation defect and a direct contact fault.

In FIG. 5, the direct current power system of FIG. 4 with an additional direct contact fault is shown. Here, the user touches the negative voltage line and is grounded through a ground resistance $R_C$. From the positive voltage rail, a current flows towards the resistance $R_1$, which is short circuited and therefore has the value 0. From there, the current travels directly through the ground connection with ground resistance $R_B$ to the ground connection of the user with resistance $R_C$ to the user and back to the RPU through the negative voltage line. Now only the ground resistance $R_B$ of the RPU 1 and the ground resistance $R_C$ of the user limit the current $I_d$. Therefore, it is possible that a significant current flows through the user, resulting in a high health risk.

Figure 6:
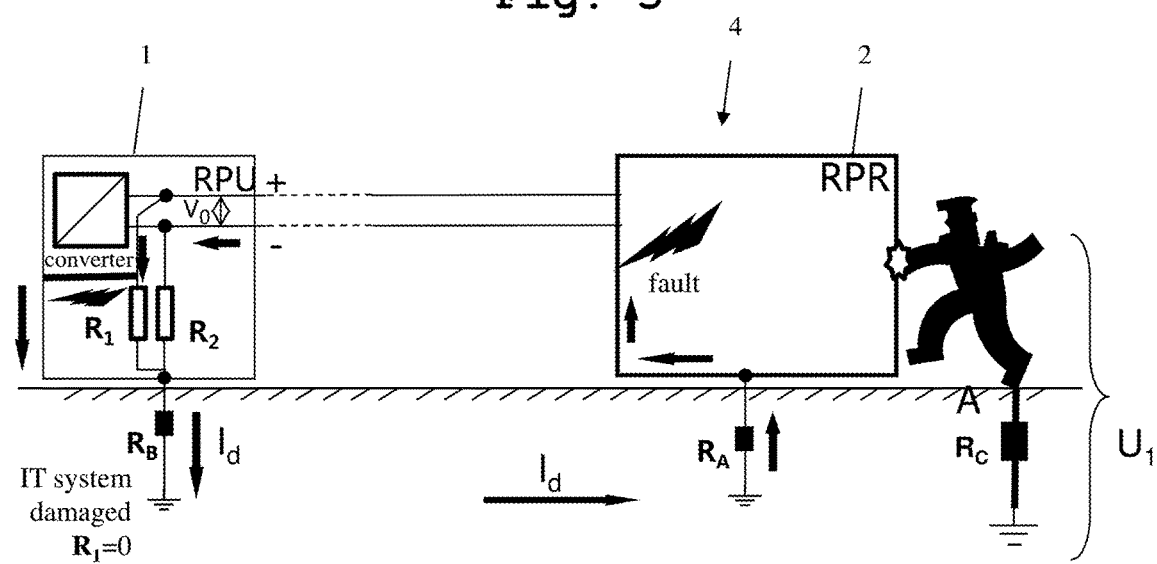
FIG. 6 shows an exemplary direct current power system with an insulation defect and an indirect contact fault.

In FIG. 6, an exemplary direct current power system 4 with an insulation defect as shown in FIG. 4 and an indirect connection fault is shown. Here again, as shown in FIG. 3, there exists an accidental connection between the negative voltage line and the conductive housing of the RPR 2. A current travels from the positive voltage rail within the RPU 1 towards the resistance $R_1$, which is short circuited and therefore exhibits the value $R_1=0$. The current therefore travels directly to the ground connection of the RPU 1 through the ground resistance $R_B$ of the RPU 1 and towards the RPR 2 and the user. The current splits into a first part flowing through the RPR 2 and its respective ground resistance $R_A$ and a second part flowing through the user and his respective ground resistance $R_C$. Since the resistance $R_1=0$, the current $I_d$ has a significant value. Even the small fraction travelling through the user poses a health risk.

In order to mitigate these risks, there exists the solution of using a residual current detector within the RPU 1. This is shown along FIG. 7 and FIG. 8. Here, the current through the positive voltage rail and the negative voltage rail is monitored. As soon as there is a significant current in balance on the positive voltage rail and the negative voltage rail, the RPU 1 ceases operation, resulting in all currents being stopped. In the cases shown in FIG. 5 and FIG. 6, now with additional use of a residual current detector, as shown in FIG. 7 and FIG. 8 no longer pose a significant health risk.

Figure 7:
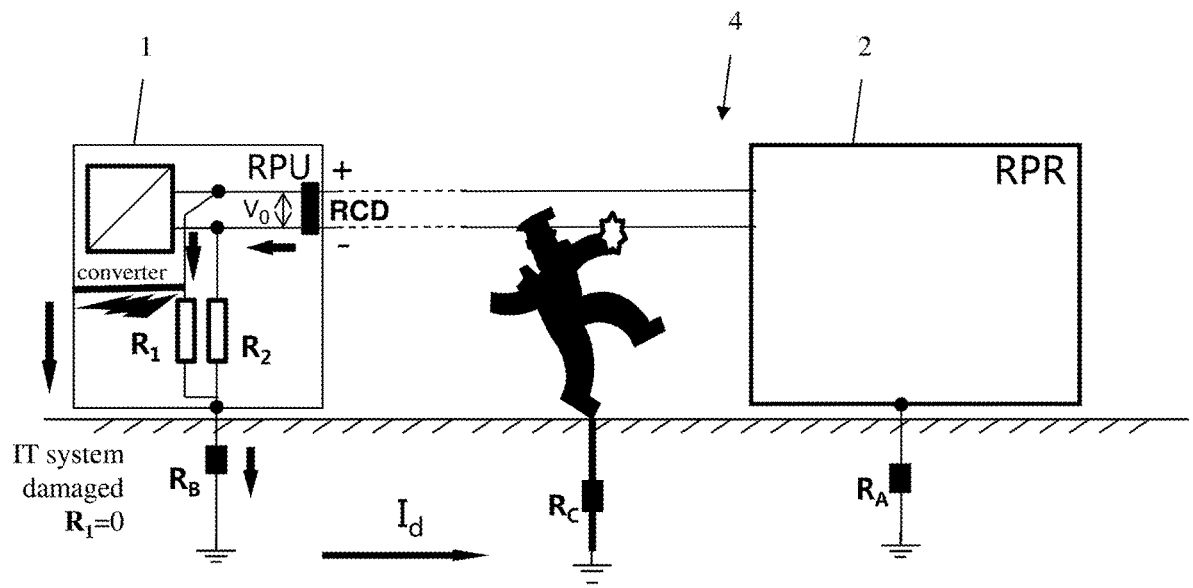
FIG. 7 shows an exemplary direct current power system comprising a residual current detector with an insulation defect and a direct contact fault.

In FIG. 7, the residual current detector stops the RPU 1 from generating the direct current power, as soon as the residual current detector detects the current imbalance between the positive voltage rail and the negative voltage rail due to the current $I_d$ flowing from the positive voltage rail through the ground resistance $R_B$ of the RPU 1 to the ground connection with the ground resistance $R_C$ of the user and back to the RPU 1 through the negative voltage line. Therefore, the user is merely subject to the current for a very brief moment until the residual current detector detects the current in balance and switches of the RPU 1.

Figure 8:
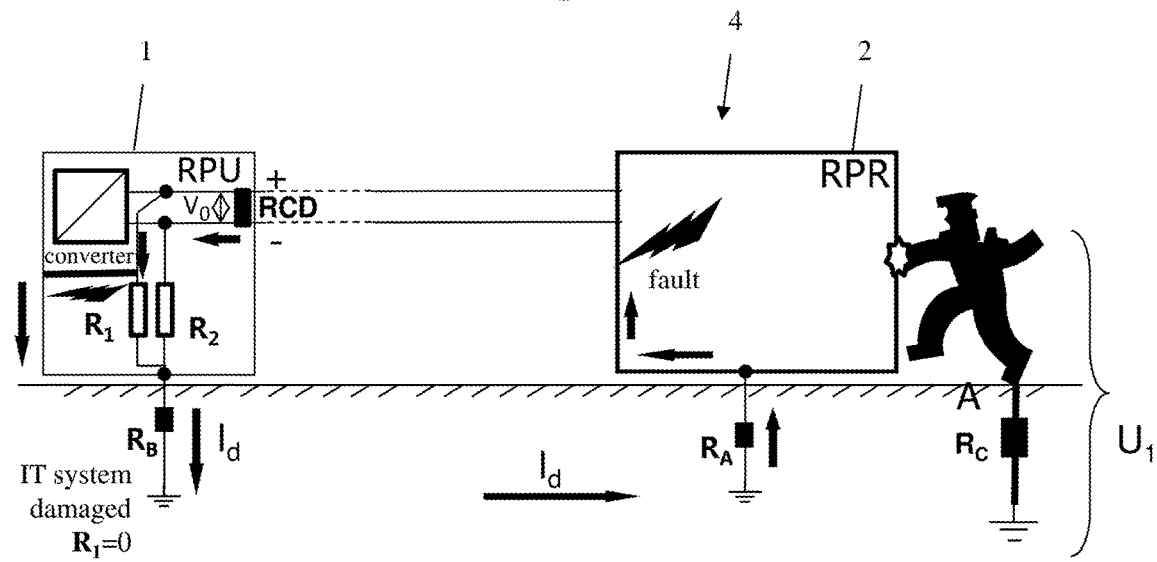
FIG. 8 shows an exemplary direct current power system comprising a residual current detector with an insulation defect and an indirect contact fault.

The same is the case for the indirect contact fault shown in FIG. 8. Here, when the user touches the conductive housing of the RPR 2, the current $I_d$ establishes itself and at least in part flows through the user. As soon as the residual current detector within the RPU 1 detects the current imbalance between the positive voltage rail and the negative voltage rail due to the current $I_d$ flowing from the positive voltage rail to the housing of the RPU 1 and through the ground resistance $R_B$ to the ground resistance $R_A$ of the RPR 2 and to the ground resistance $R_C$ of the user and back through the negative voltage line. Therefore also here, the user is only subjected to the current for a very brief period, and therefore serious health risk is mitigated.

Such residual current detectors for example are magnetic current detectors or current shunts. It is though very difficult to accurately measure these currents, since during regular operation, the currents on the positive voltage rail and on the negative voltage rail are in the range of several ampere, while the residual current value—the difference of the current on the positive voltage rail and on the negative voltage rail is only in the milliampere range. This makes it necessary to have very accurate and at the same time expensive current sensors for detecting the residual current.

Figure 9:
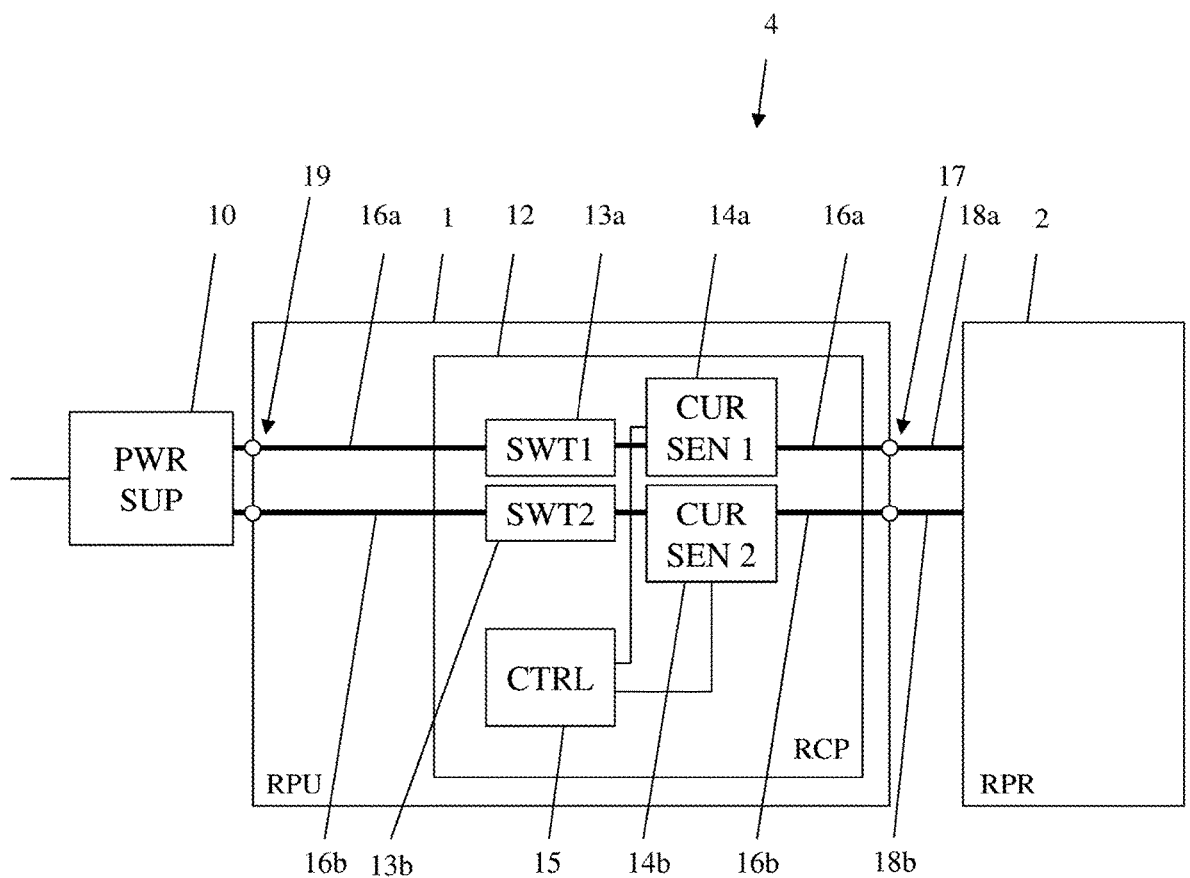
FIG. 9 shows a first embodiment of the direct current power system according to the second aspect of the invention and a first embodiment of the remote power unit of the first aspect of the invention in a block diagram.

In FIG. 9, a first embodiment of the direct current power system 4, according to the second aspect of the invention including a RPU 1 according to the first aspect of the invention is shown. The direct current power system 4 comprises a RPU 1 connected to a RPR 2 through a positive voltage line 18a and a negative voltage line 18b and a direct current interface 17.

The direct current power system 4 comprises a power supply 10 which provides the direct current power. The direct current power is provided to the RPU 1 through a power supply interface 19.

Moreover, the RPU 1 comprises a residual current protection circuit 12, which moreover comprises a first switch 13a connected to the power supply 10 by a positive voltage rail 16a and a second switch 13b connected to the power supply 10 through a negative voltage rail 16b. The switches 13a, 13b are moreover each connected to a current sensor 14a, 14b. The first switch 13a is connected to a first current sensor 14a, while the second switch 13b is connected to a second current sensor 14b. The current sensors 14a, 14b are moreover connected to the RPR 2. Moreover, the residual current protection circuit 12 comprises a controller 15, which is connected to the first current sensor 14a and the second current sensor 14b.

During operation, the power supply 10 provides the direct current power to the first switch 13a and to the second switch 13b through the power supply interface 19, the positive voltage rail 16a and the negative voltage rail 16b. When the switches 13a and 13b are closed, a respective voltage rail 16a, 16b is connected to the respective current sensor 14a, 14b. When the respective switch 13a, 13b is open, there is no connection of the direct current power from the power supply 10 to the current sensor 14a, 14b.

During operation, the first current sensor 14a measures a first residual current between the first switch 13a and the RPR 2 while the first switch is closed and the second switch is open. The second current sensor 14b measures a second residual current between the second switch 13b and the RPR 2, while the second switch is closed and the first switch is open. These current values are handed to the controller 15, which compares them to a residual current threshold. This residual current threshold is set to a value, which assures a safe operation while at the same time preventing erroneous false alarms. In an example, the residual current threshold can be selected from 2 mA to 200 mA, preferable 25 mA. A residual current event is defined as the residual current exceeding the residual current threshold. The controller 15 therefore detects a residual current event if the residual current of any of the switches 13a, 13b exceeds the residual current threshold.

Therefore, the current sensors 14a, 14b only have a small range of values, they need to be able to measure. Since the residual current is measured in a time when no operating current travels between the RPU 1 and the RPR 2, only a distinction between nearly zero current during regular operation and a current in the milliampere range, in case of a fault is necessary. Thus the residual current can be detected rather precisely according to the embodiment of the present invention.

Figure 10:
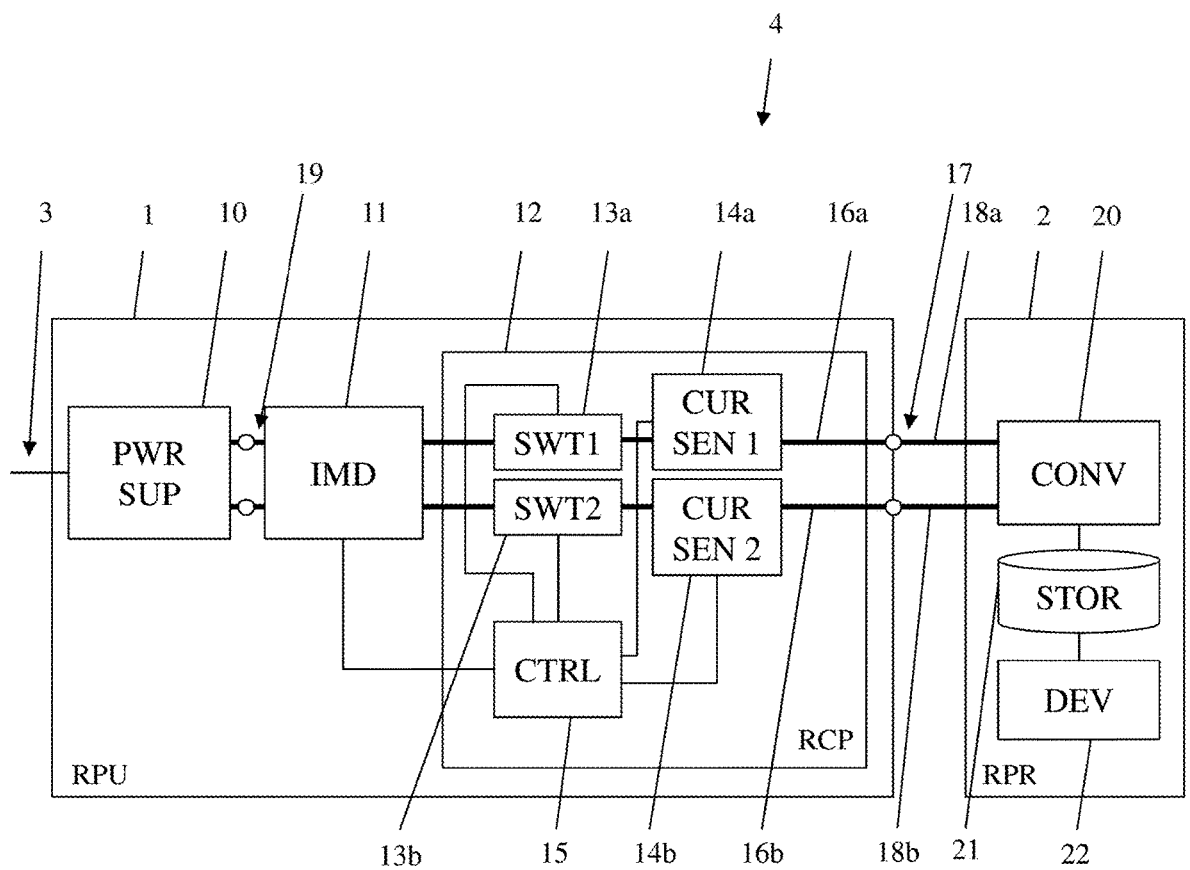
FIG. 10 shows a second embodiment of the direct current power system according to the second aspect of the invention and a second embodiment of the remote power unit of the first aspect of the invention in a block diagram.

In FIG. 10, a second embodiment of the direct current power system 4 and a second embodiment of the RPU 1 is shown. Here, the power supply 10 is integrated into the RPU 1.

Moreover, the RPU 1 additionally comprises an insulation monitoring device 11, which is connected between the power supply 10 and the residual current protection circuit 12. The insulation monitoring device 11 monitors the intactness of the insulation of the positive voltage rail 16a and the negative voltage rail 16b within the RPU 1. This is done by measuring a current between the housing of the RPU 1 and the respective voltage rail 16a, 16b. As soon as a current between the housing and the positive voltage rail 16a and/or the negative voltage rail 16b has a significant value, meaning that it exceeds an insulation monitoring threshold, an insulation defect is detected. Such an insulation defect is not problematic for regular operation, since merely a tiny fraction of the power provided by the power supply 10 flows through the housing to ground. It is still possible to transmit power to the RPR 2. As explained earlier, such an insulation defect though is very problematic, if an additional direct or indirect contact fault occurs, as shown in FIG. 5 and FIG. 6.

In a very cautious approach, the RPU 1 could cease operation as soon as the insulation monitoring device 11 detects an insulation fault. This can be achieved by switching the switches 13a and 13b to open state or even deactivating the power supply 10. In a less cautious approach, targeted more at availability of the system 4, the insulation monitoring device 11 after detecting an insulation fault would merely activate the residual current protection circuit 12, which then monitors, if an additional direct or indirect contact fault occurs. In case of a detection of no insulation defect, the residual current protection circuit 12 then does not need to operate. The switches 13a, 13b can always stay in closed status or position.

In addition, in this embodiment, the controller 15 is additionally connected to the first switch 13a and the second switch 13b. The controller 15 controls the operation of the switches 13a, 13b. Especially, the controller opens and closes the switches 13a and 13b in an alternating and periodical manner. Especially, the controller controls the switches to have an opening time of 1 ms to 100 ms, preferably 5 ms to 20 ms, most preferably to 10 ms and a closed time of 10 ms to 1000 ms, preferably 50 ms to 200 ms, most preferably to 100 ms. Opening time means the time during which the switch 13a, 13b is in the open state, closed time indicating the time during which the switch 13a, 13b is in the closed state. It can be understood that "open" indicates that the corresponding switch is turned off, and "closed" indicates that the corresponding switch is turned on.

When detecting a residual current event, indicating that the residual current of either the first current sensor 14a or the second current sensor 14b exceeds the residual current threshold, the controller 15 can deactivate the switches 13a and 13b, setting both of them to the open state. This halts power transmission and prevents a health risk for the user. In order to avoid erroneous switching off the switches 13a, 13b, the controller 15 may also wait until two consecutive residual current events have been detected so that a single glitch leading to an erroneous detection of a single residual current event does not trigger a switching off.

Moreover, in FIG. 10, the inner workings of the RPR 2 are shown in greater detail. The RPR 2 here comprises a converter 20, which is connected to a positive voltage line 18a and to a negative voltage line 18b. The positive voltage line 18a is connected to the positive voltage rail 16a through an interface 17. The negative voltage line 18b is connected to the negative voltage rail 16b through the interface 17. The converter 20 therefore receives the direct current power from the RPU 1, and converts it to a power form useful for a device 22, which is operated by the RPR 2. Between the converter 20 and the device 22, additionally, a storage unit 21 is connected. The storage unit 21 stores energy during the times in which power is transmitted from the RPU 1 to the RPR 2. The times in which power is transmitted occur when the first switch 13a and the second switch 13b are both closed. During the times during which the residual currents are measured, meaning that the first switch 13a or the second switch 13b are open, the storage unit 21 provides energy to the device 22, so that the device 22 can operate continuously even when no power is transmitted from the RPU 1 to the RPR 2.

Figure 11:
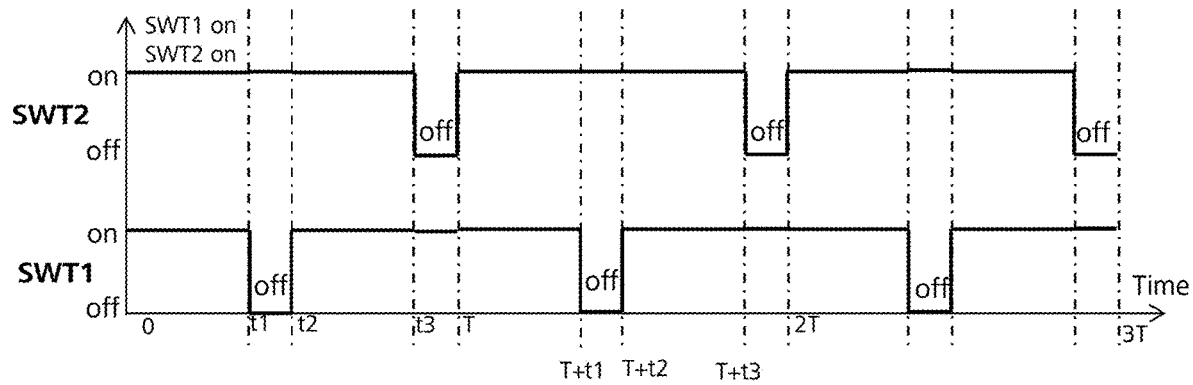
FIG. 11 shows switching times of a first switch and a second switch in a third embodiment of the remote power unit of the first aspect of the invention during regular operation.

In FIG. 11, signals indicating the switch states during regular operation are shown. These signals can for example be the actual control signals of the switches. Between time zero and $t_1$, both switches are on, meaning they are in the closed state. From $t_1$ to $t_2$, the first switch is in off, meaning it is in the open state. Between $t_2$ and $t_3$ both switches are on. Now between $t_3$ and T, the second switch is off. Here, the alternating manner of switching one of the switches off and switching both switches on can readily be seen. Also it is evident here, that the time during which both switches are on is significantly longer than the time during which alternatingly the switches are turned off.

Figure 12:
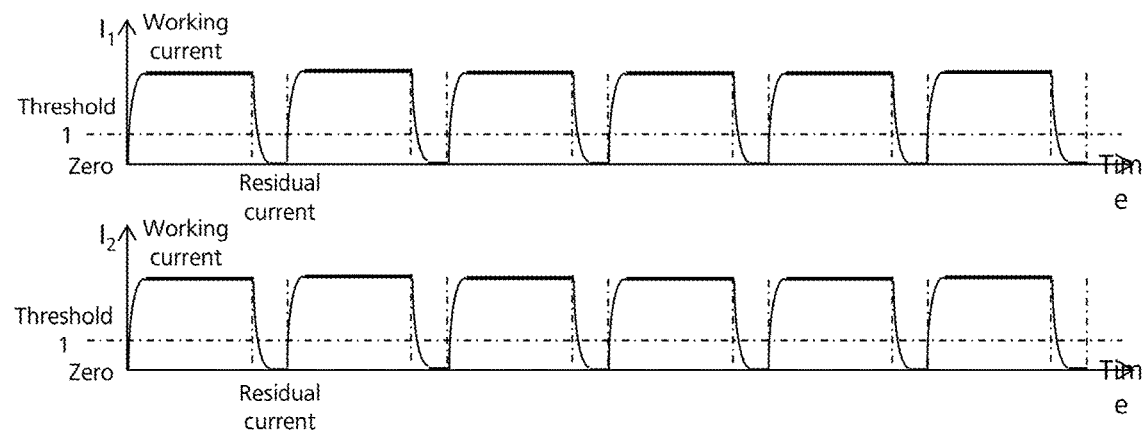
FIG. 12 shows currents measured in a fourth embodiment of the remote power unit of the first aspect of the invention during regular operation.

In FIG. 12, signals showing the currents measured by the current sensors are shown. Also here regular operation is shown. While both switches are closed, a stable working current establishes itself. As soon as one of the switches is opened, a residual current close to zero is detected. This residual current is significantly below the residual current threshold shown in FIG. 12. Therefore, no residual current event is detected.

Figure 13:
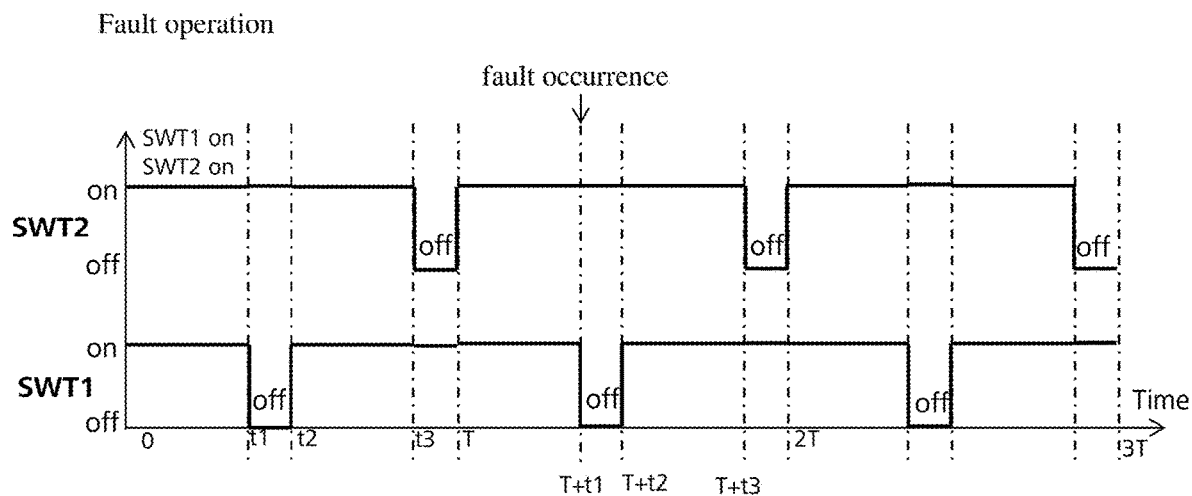
FIG. 13 shows switching times of a first switch and a second switch of a fifth embodiment of the remote power unit of the first aspect of the invention during fault operation.

In FIG. 13, signals indicating the switching states of the switches when a fault occurs is shown. Also here, the signals can for example be the actual control signals for controlling the switches. In this example, the switches switch at the same time no matter if a fault occurs or not. This is not to be understood as a limitation though.

Figure 14:
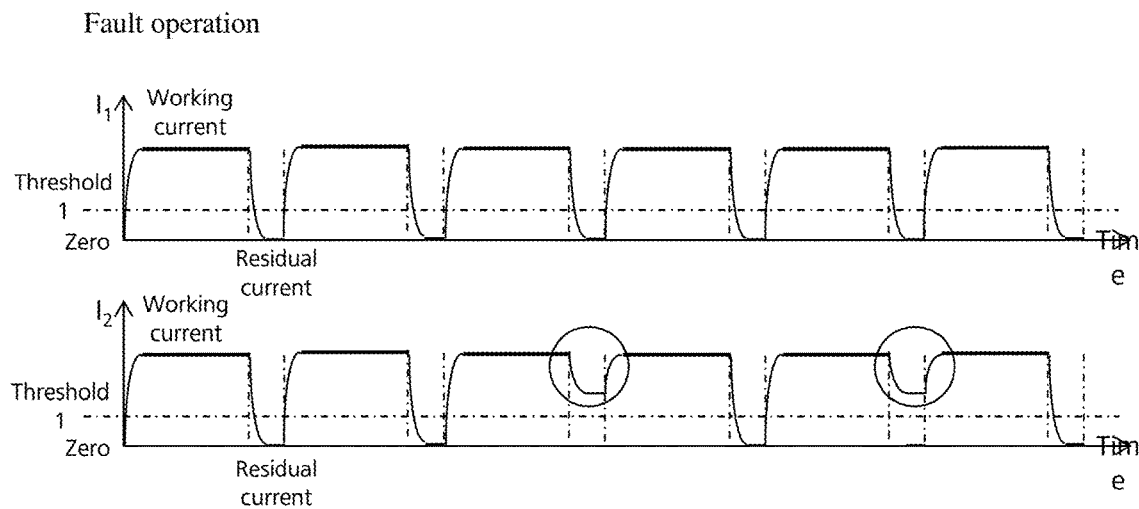
FIG. 14 shows currents measured in a sixth embodiment of the remote power unit of the first aspect of the invention during fault operation.

In FIG. 14, signals indicating the currents on the negative voltage rail and the positive voltage rail are shown, as in FIG. 12. Since the fault occurs on the negative voltage rail, during operation of the second switch, which belongs to the positive voltage rail, no problems are detected. Therefore, the current $I_1$ oscillates between the stable working current and the almost zero residual current. The current $I_2$ though, as soon as the fault occurs, exhibits a value significantly above the residual current threshold indicated by the circles around the respective regions of the diagram. Therefore, the controller 15 detects residual current events at these times. Either already at the occurrence of the first residual current event or at least at the occurrence of the second residual current event, the controller sets both switches to the off state so as to prevent a health hazard to the user.

Figure 15:
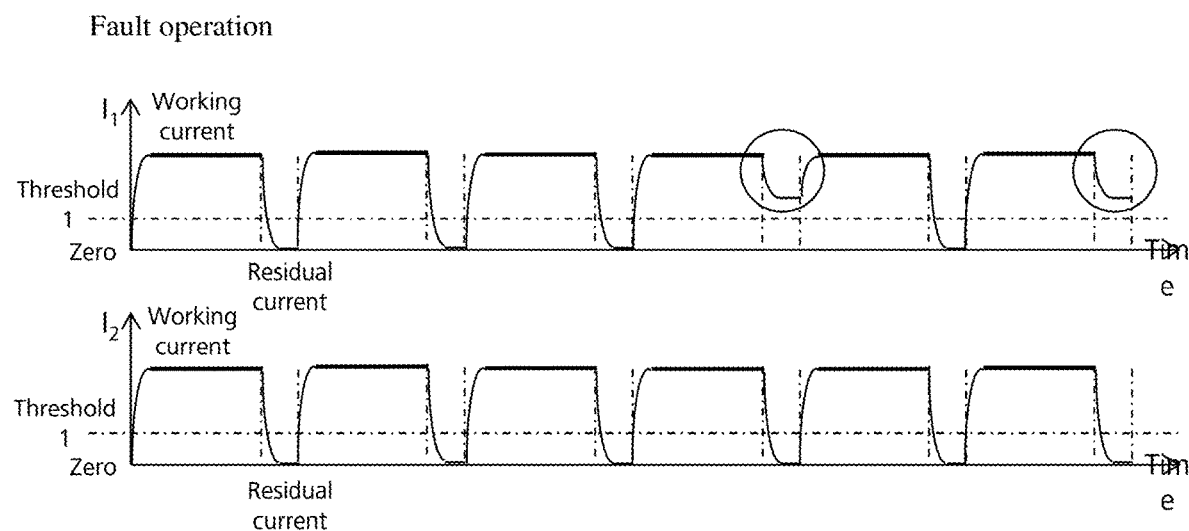
FIG. 15 shows currents measured in a seventh embodiment of the remote power unit of the first aspect of the invention during an alternate fault operation.

In FIG. 15, signals indicating the currents measured by the current sensors are shown, for a fault on the positive voltage rail is shown. Here, the current $I_1$ exhibits residual current above the residual current threshold as soon as the fault occurs.

Figure 16:
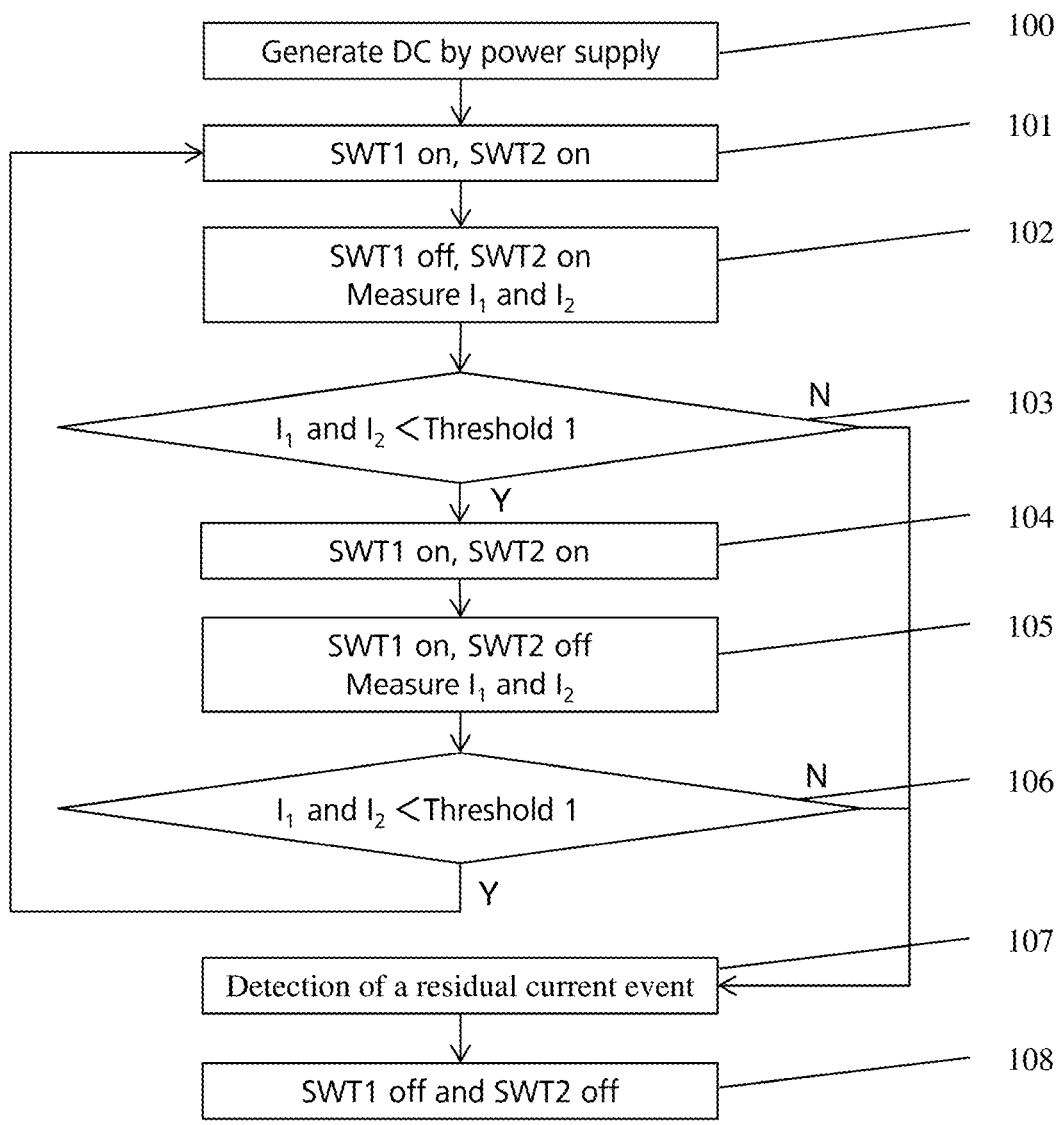
FIG. 16 shows a first embodiment of the direct current power system fault detection method according to the third aspect of the invention in a flow diagram.

In FIG. 16, a first embodiment of the direct current power system fault detection method is shown. In a first step 100, DC power is generated by a power supply. In a second step 101 a first switch and a second switch are in the on state. In a third state 102 the first switch is switched off, while the second switch is kept on. During this state, the currents $I_1$ and $I_2$ are measured. In a fourth step 103, it is checked, if one of the currents $I_1$, $I_2$ or even both these currents are below the residual current threshold. If this is not the case, a residual current event is detected in an eighth step 107. If this is the case though, both switches are turned on again in a fifth step 104. After this, in a sixth step 105, the second switch is turned off, while the first step is kept on. During this state, again both currents $I_1$, $I_2$ are measured. In a seventh step 106, it is again checked, if either or both of the currents $I_1$, $I_2$, are below the residual current threshold. In case this is not the case, again it is continued with the detection of a residual current event in an eighth step 107. If both currents are below the threshold though, it is continued with the second step 101. Therefore, as soon as a residual current event is detected in step 107, in a ninth step 108, both switches are turned off stopping all current flow and protecting the user.

Figure 17:
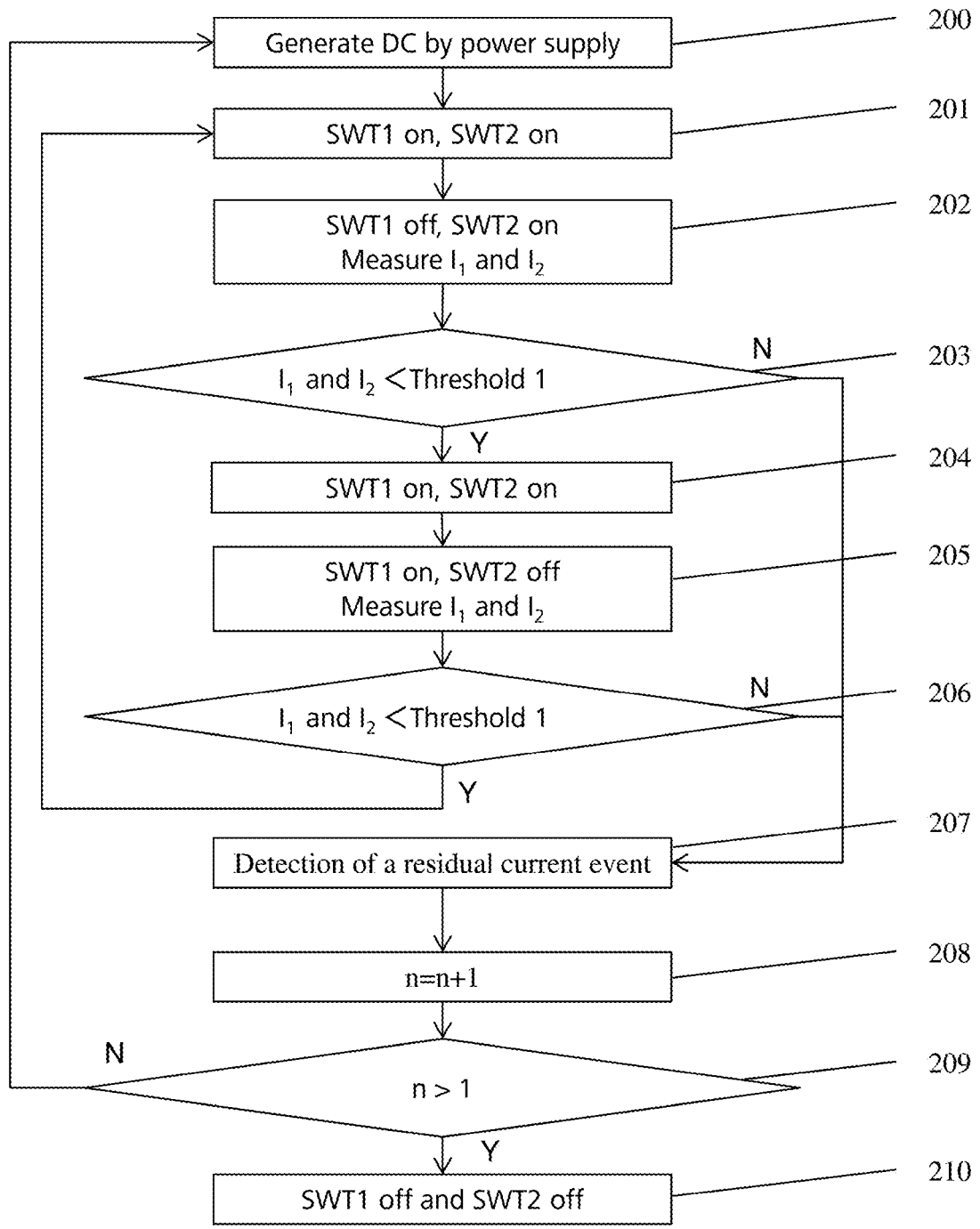
FIG. 17 shows a second embodiment of the direct current power system fault detection method according to the third aspect of the invention in a flow diagram.

In FIG. 17, an alternative embodiment of the direct current power system fault detection method is shown. Here, the steps 200-207 are identical to the steps 100-107 of FIG. 16. Here, after a residual current event is detected in step 207, a residual current counter n is incremented in a ninth step 208. After this, in a tenth step 209, it is checked, if the residual current event counter n is greater than one. If this is not the case, the method continues at step 200. In case the residual current event counter is greater than one, in an eleventh step 210 both switches are turned off. In this embodiment, two consecutive residual current events need to be detected in order to assure that actually a fault is occurring. This leads to an increase in system availability, but at the cost of a slightly reduced system safety to the user.

Figure 18:
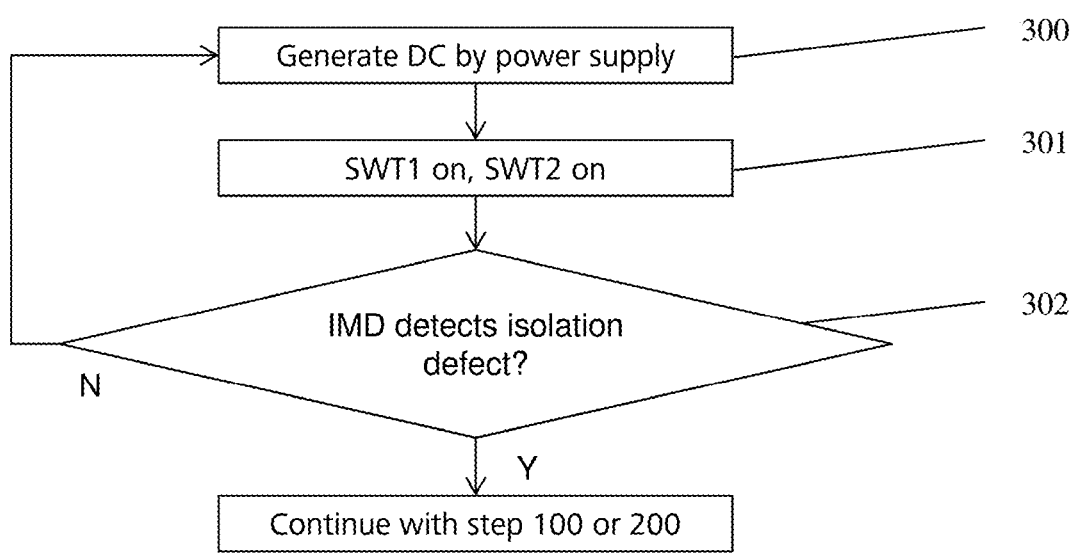
FIG. 18 shows a third embodiment of the direct current power system fault detection method according to the third aspect of the invention in a flow diagram.

In FIG. 18, a third embodiment of the direct power system fault detection method is shown. Here, the operation of the insulation defect monitor is shown. In a first step 300 direct current power is generated by the power supply. In a second step 301, both switches are turned on. In a third step 302 it is checked, for example by the insulation monitor, if an insulation defect is present. If no insulation defect is present, the method is continued at step 300. If an insulation defect though is present, the method continues with step 100 or 200 of FIG. 16 or FIG. 17. This means that only when the insulation monitor detects an insulation fault, the residual current protection methods shown in FIG. 16 and FIG. 17 are actually used. As long as there is no insulation defect, it is not necessary to check if a residual current occurs, since it is not possible that a residual current occurs.

The invention is not limited to the examples and especially not to specific DC voltage levels of the system. The characteristics of the exemplary embodiments can be used in any combination.

Aspects of the invention have been described in conjunction with various embodiments herein. However, other variations to the disclosed embodiments can be understood and effected by those skilled in the art in practicing the claimed invention, from a study of the drawings, the disclosure and the appended claims. In the claims, the word "comprising" does not exclude other elements or steps and the indefinite article "a" or "an" does not exclude a plurality. A single processor or other unit may fulfill the functions of several items recited in the claims. The mere fact that certain measures are recited in usually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the internet or other wired or wireless communication systems.

The invention claimed is:

1. A remote power unit for providing direct current power to a remote power receiver in a direct current power system, wherein the remote power unit comprises:
    a residual current protection circuit, comprising:
        a power supply interface, configured to receive direct current power from a power supply;
        a direct current interface, configured to connect the remote power unit to the remote power receiver via a positive voltage line and a negative voltage line;
        a first switch, configured to open a positive voltage rail between the power supply interface and the direct current interface;
        a second switch, configured to open a negative voltage rail between the power supply interface and the direct current interface;
        a first current sensor, configured to measure a first residual current between the first switch and the direct current interface, while the first switch is closed and the second switch is open;
        a second current sensor, configured to measure a second residual current between the second switch and the direct current interface, while the second switch is closed and the first switch is open; and
        a controller, configured to detect a residual current event, if at least one of the first residual current and the second residual current are above a residual current threshold.

2. The remote power unit of claim 1, wherein the controller is configured to control the operation of the first switch and the second switch in a periodical and alternating manner.

3. The remote power unit of claim 1, wherein the controller is further configured to perform at least one of:
    close the first switch and the second switch;
    open the first switch and close the second switch; and
    close the first switch and open the second switch.

4. The remote power unit of claim 1, wherein the controller is further configured to set at least one of:
    an opening time of the first switch and an opening time of the second switch to 1 ms to 100 ms, preferably 5 ms to 20 ms; and
    a closed time of the first switch and a closed time of the second switch to 10 ms to 1000 ms, preferably 50 ms to 200 ms.

5. The remote power unit of claim 1, wherein the controller is further configured to switch the first switch and the second switch to open, if a residual current event is detected.

6. The remote power unit of claim 1, wherein the controller is further configured to switch the first switch and the second switch to open, if at least two consecutive residual current events are detected.

7. The remote power unit of claim 1, wherein the remote power unit further comprises an insulation monitor configured to detect if at least one of the positive voltage rail and the negative voltage rail has an insulation defect.

8. The remote power unit of claim 7, wherein the residual current protection circuit is configured to operate only if the insulation monitor has detected that at least one of the positive voltage rail and the negative voltage rail has an insulation defect; and
    wherein the first switch and the second switch are closed, when the residual current protection circuit is not operating.

9. The remote power unit of claim 1, wherein the first switch and the second switch are transistors.

10. The remote power unit of claim 1, wherein the first current sensor and the second current sensor are shunt current sensors or magnetic current sensors.

11. The remote power unit of claim 1, wherein the remote power unit further comprises a power supply, configured to provide direct current power to the remote power unit through the power supply interface.

12. A direct current power system, comprising
    a remote power unit for providing direct current power to a remote power receiver in a direct current power system, and
    a remote power receiver,
    wherein the remote power unit comprises:
    a residual current protection circuit, comprising:
    a power supply interface, configured to receive direct current power from a power supply;
    a direct current interface, configured to connect the remote power unit to the remote power receiver via a positive voltage line and a negative voltage line;
    a first switch, configured to open a positive voltage rail between the power supply interface and the direct current interface;
    a second switch, configured to open a negative voltage rail between the power supply interface and the direct current interface;
    a first current sensor, configured to measure a first residual current between the first switch and the direct current interface, while the first switch is closed and the second switch is open;
    a second current sensor, configured to measure a second residual current between the second switch and the direct current interface, while the second switch is closed and the first switch is open; and
    a controller, configured to detect a residual current event, if at least one of the first residual current and the second residual current are above a residual current threshold.

13. The direct current power system of claim 12, wherein the remote power receiver is connected to the remote power unit via a positive voltage line and a negative voltage line.

14. The direct current power system of claim 12, wherein the remote power receiver comprises an energy storage, configured to:
    store energy while the first switch and the second switch are closed, and power is transmitted from the remote power unit to the remote power receiver; and provide the stored energy while the first switch or the second switch are open, and no power is transmitted from the remote power unit to the remote power receiver.

15. A direct current power system fault detection method, wherein a remote power unit of the remote power system provides direct current power to a remote power receiver of a direct current power system, wherein the method comprises the following steps:
generating direct current power by a power supply;
switching a first switch, arranged within a positive voltage rail of the remote power unit, on, and switching a second switch, arranged within a negative voltage rail of the remote power unit on;
switching the first switch off;
measuring a first residual current between the first switch and a direct current interface of the remote power unit and measuring second residual current between the second switch and the direct current interface;
determining, if at least one of the first residual current and the second residual current exceed a residual current threshold;
determining a residual current event, if at least one of the first residual current and the second residual current exceed a residual current threshold;
switching the first switch and the second switch on;
switching the second switch off;
measuring a first residual current between the first switch and a direct current interface of the remote power unit and measuring second residual current between the second switch and the direct current interface;
determining, if at least one of the first residual current and the second residual current exceed a residual current threshold;
determining a residual current event, if at least one of the first residual current and the second residual current exceed a residual current threshold; and
switching the first switch and the second switch off, if at least two residual current event are detected.

16. A residual current protection circuit, for use in a remote power unit providing direct current power to a remote power receiver, wherein the residual current protection circuit comprises:
a power supply interface, configured to receive direct current power from a power supply;
a direct current interface, configured to connect the remote power unit to the remote power receiver via a positive voltage line and a negative voltage line;
a first switch, configured to open a positive voltage rail between the power supply interface and the direct current interface;
a second switch, configured to open a negative voltage rail between the power supply interface and the direct current interface;
a first current sensor, configured to measure a first residual current between the first switch and the direct current interface, while the first switch is closed and the second switch is open;
a second current sensor, configured to measure a second residual current between the second switch and the direct current interface, while the second switch is closed and the first switch is open; and
a controller, configured to detect a residual current event, if the first residual current and/or the second residual current are above a residual current threshold.

* * * * *